United States Patent [19]
Kitora et al.

[11] Patent Number: 4,897,705
[45] Date of Patent: Jan. 30, 1990

[54] LATERAL BIPOLAR TRANSISTOR FOR LOGIC CIRCUIT

[75] Inventors: Takatsugu Kitora; Youichirou Taki, both of Itami, Japan

[73] Assignee: Mitsubishi Denki Kabushiki Kaisha, Tokyo, Japan

[21] Appl. No.: 328,799

[22] Filed: Mar. 23, 1989

Related U.S. Application Data

[63] Continuation of Ser. No. 32,573, Apr. 1, 1987, abandoned.

[30] Foreign Application Priority Data

May 6, 1986 [JP] Japan ................................. 61-105337

[51] Int. Cl.$^4$ ............................................. H01L 29/72
[52] U.S. Cl. ......................................... 357/35; 357/46; 357/92; 357/34; 357/15; 357/40; 307/454; 307/456
[58] Field of Search ...................... 357/35, 34, 40, 43, 357/15, 46, 92; 307/454, 456

[56] References Cited

U.S. PATENT DOCUMENTS
4,433,258  2/1984  Kaneko et al. ...................... 307/456

FOREIGN PATENT DOCUMENTS
56-62361  5/1981  Japan ..................................... 357/35
57-88769  6/1982  Japan ..................................... 357/35

OTHER PUBLICATIONS
Guide Book of Ultra LSIs, vol. 4, Bipolar Integrated Circuits published by Kindai Kagakusha on Dec. 1, 1984, p. 21.

Primary Examiner—William Mintel
Attorney, Agent, or Firm—Oblon, Spivak, McClelland, Maier & Neustadt

[57] ABSTRACT

A semiconductor integrated circuit device comprises a lateral pnp transistor having a base to which an input signal is applied and a first npn transistor having a base to which a potential appearing at the emitter of the pnp transistor is applied, which transistors constitute a bipolar logic circuit. In the circuit device, the width of the base of the pnp transistor is determined to be in the range of from 5 μm to 7 μm.

2 Claims, 2 Drawing Sheets

LATERAL BIPOLAR TRANSISTOR FOR LOGIC CIRCUIT

This application is a continuation of application Ser. No. 32,573, filed on 04/01/87, now abandoned.

BACKGROUND OF THE INVENTION

FIELD OF THE INVENTION

The present invention relates to a semiconductor integrated circuit device. More particularly, it relates to an improvement in the base of a lateral pnp transistor for a TTL (transistor - transistor logic) semiconductor integrated circuit device.

DISCUSSION OF BACKGROUND

FIG. 3 is a circuit diagram showing a conventional semiconductor integrated circuit device on the same semiconductor base substrate.

In FIG. 3, reference character $Q_1$ refers to a lateral pnp transistor having the base for receiving an input signal, the collector connected to a low potential point such as the ground and the emitter connected to a high potential power source Vcc through a resistor $R_1$. A first npn transistor $Q_2$ has the base connected to the emitter of the lateral pnp transistor $Q_1$ and the collector connected to the high potential power source Vcc through a resistor $R_2$. A second npn transistor $Q_3$ has a base connected to the emitter of the npn transistor $Q_2$ and a collector connected to the high potential power source Vcc through a resistor $R_3$. A third npn transistor $Q_4$ has a base connected to the emitter of the second npn transistor $Q_3$, an emitter connected to the low potential point and a collector connected to an output terminal. A reference character $Q_5$ designates a Darlington transistor as a control transistor having a base connected to the collecter of the second npn transistor $Q_3$, a collector connected to the high potential power source Vcc through a resistor $R_4$ and an emitter connected to the output terminal. The Darlington transistor $Q_5$ comprises a fourth npn transistor having a base connected to the collector of the second npn transistor $Q_3$ and a collector connected to the high potential power source Vcc, and a fifth transistor having a base connected to the emitter of the fourth transistor, a collector connected to the collector of the fourth transistor and an emitter connected to the output terminal.

There is a capacitive load between the emitter of the lateral pnp transistor $Q_1$ and the base of the first npn transistor $Q_2$. However, in the conventional TTL semiconductor integrated circuit device as shown, for instance, in FIGS. 2–13 of "BIPOLAR INTEGRATED CIRCUITS IN A GUIDE BOOK 4 FOR ULTRA-LSIs", the width of the base of the lateral pnp transistor is fixedly determined (for instance, 4 $\mu$m in the case of ALS TTL) in accordance with the standard of design inspite of the magnitude of the capacitive load.

The operation of the semiconductor integrated circuit device shown in FIG. 3 will be described.

When an input signal applied to the base of the lateral pnp transistor $Q_1$ is changed from a low level to a high level, an electric potential appearing at the emitter of the transistor $Q_1$ will increase with a time constant determined by the input resistor $R_1$ and a capacitive load in a line connecting the emitter of the lateral pnp transistor $Q_1$ and the base of the npn transistor $Q_2$. When the pnp transistor $Q_1$ reaches an operable voltage (a voltage capable of turning on the three npn transistors $Q_2$, $Q_3$, $Q_4$ following the pnp transistor $Q_1$), an output signal is reversed.

Thus, in the conventional semiconductor integrated circuit device in which the rising time of the emitter potential of the lateral pnp transistor $Q_1$ is determined by the time constant given by the capacitive load and the input resistor $R_1$, there was a problem that when the capacitive load becomes large, the rising time of the emitter potential was delayed, and therefore, a propagation time from the input to the output of the signal was delayed.

SUMMARY OF THE INVENTION

It is an object of the present invention to provide a semiconductor integrated circuit device for improving output propagation time which is given when an input signal applied to the base of a lateral pnp transistor is changed from a low level to a high level.

The present invention is to provide a semiconductor integrated circuit device comprising a lateral pnp transistor having a base to which an input signal is applied and a first npn transistor having a base to which a potential appearing at the emitter of the pnp transistor is applied, both transistors constituting a bipolar logic circuit, wherein the width of the base of the pnp transistor is in the range of from 5 $\mu$m to 7 $\mu$m.

The present invention is to provide a semiconductor integrated circuit device which comprises a semiconductor base substrate, an N type impurity layer formed in a main surface of the semiconductor base substrate as a base layer, of a lateral pnp transistor, to which a conducting layer for supplying an input signal is connected, a first P type impurity layer formed in a main surface of the N type impurity layer as an emitter layer of the lateral pnp transistor, a second P type impurity layer formed in the main surface of the N type impurity layer as a collector layer of the lateral pnp transistor, the second P type impurity layer being separated from the emitter layer by interposing therebetween the base layer having a width of 5 $\mu$m–7 $\mu$m, and an npn transistor formed in the same main surface of the semiconductor base substrate and having a base layer connected to the first P type impurity layer through a conducting layer.

BRIEF DESCRIPTION OF THE DRAWINGS

More complete appreciation of the invention and many of the attendant advantages thereof will be readily obtained as the same becomes better understood by reference to the following detailed description when considered in connection with the accompanying drawings. Wherein.

DETAILED DESCRIPTION OF PREFERRED EMBODIMENT

A semiconductor integrated circuit device according to the present invention is featured by determining the width of the base of a lateral pnp transistor to be in the range from 5 $\mu$m to 7 $\mu$m with the consequence that the diffusion capacitance between the base and emitter is increased so that a change in a potential at the base is transmitted to the emitter through a capacitance function due to the diffusion capacitance, whereby rising time of an emitter potential of a TTL input transistor is shortened.

An embodiment of the present invention will be described with reference to the drawings.

Figure 1:
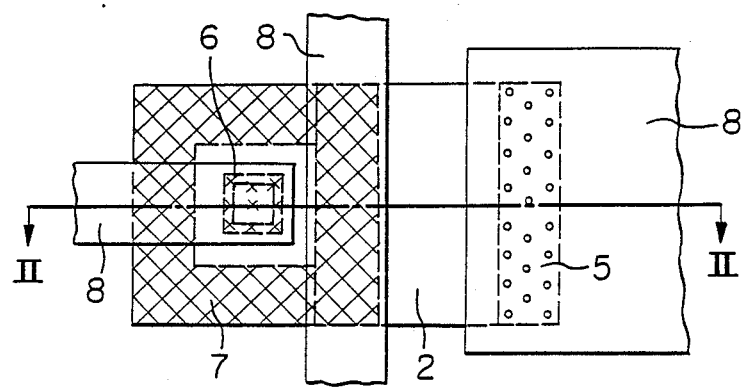
FIG. 1 is a plane view of an embodiment of the lateral pnp transistor used for a semiconductor integrated circuit device according to the present invention.
Figure 2:
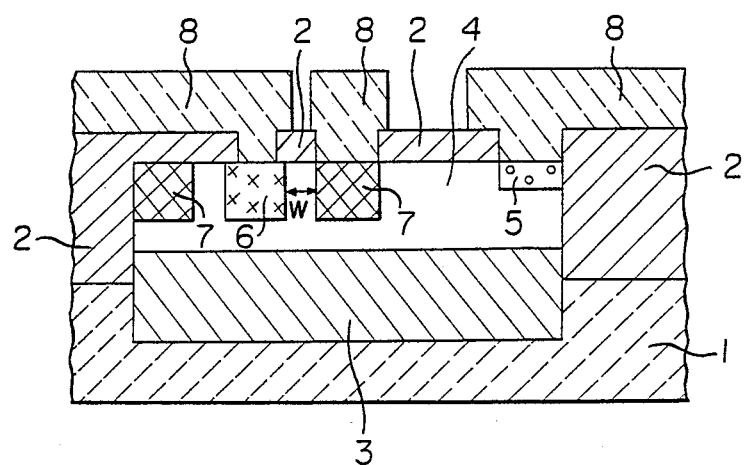
FIG. 2 is a cross-sectional view taken along a line II—II in FIG. 1.

FIGS. 1 and 2 are respectively a plane view and a cross-sectional view showing an input lateral pnp transistor for a TTL semiconductor integrated circuit device.

In FIGS. 1 and 2, a reference numeral 1 designates a semiconductor base substrate such as a silicon base substrate, a numeral 2 designates an oxide film for separation, numerals 3 and 5 designate N+type impurity layers, a numeral 4 designates an N−type impurity layer formed in a main surface of the semiconductor base substrate 1 as a base layer of a lateral pnp transistor. An input signal is applied to the base. A first P+type impurity layer 6 is formed in a main surface of the N−type impurity layer 4 as an emitter layer of the lateral pnp transistor. A second P+type impurity layer 7 is also formed in the main surface of the N−type impurity layer 4. The second P+type impurity layer 7 constitutes a collector layer which surrounds the emitter layer 6. Numerals 8 designate aluminum wires.

Figure 3:
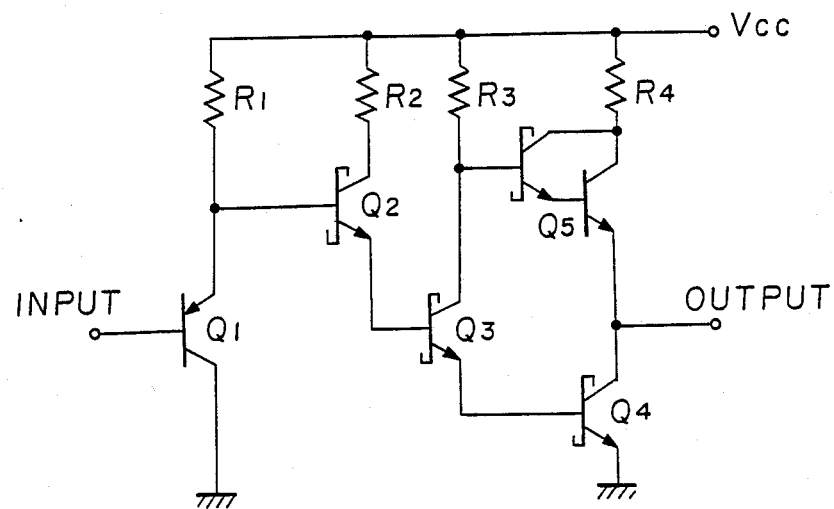
FIG. 3 is a circuit diagram showing a typical bipolar logic circuit.

The circuit of the input lateral pnp transistor of the present invention is substantially the same as that shown in FIG. 3 provided that the width of a base portion between the first P+type impurity layer 6 as the emitter portion of the lateral pnp transistor and the second P+type impurity layer 7 as the collector of the same transistor which constitutes an input transistor for a TTL circuit, is determined in the range of from 5 μm to 7 μm. The ground of the determination of the values is as follows.

In the TTL circuit shown in FIG. 3, a bipolar logic circuit is constituted in such a manner that a capacitive load in a wire connecting the emitter of the lateral pnp transistor $Q_1$ to the base of the npn transistor $Q_2$ is determined to be 0.17 PF and an input signal is applied to the base of the lateral pnp transistor $Q_1$; a potential appearing at the emitter of the transistor $Q_1$ is applied to the base of the npn transistor $Q_2$, whereby an output condition is changed depending on the condition of the pnp transistor $Q_2$.

The transistors $Q_2$ to $Q_4$ may be schottky transistors.

In this embodiment, when the input signal to be applied to the base of the lateral pnp transistor $Q_1$ is changed from a low level (such as 0.3 V) to a high level (such as 3.5 V), a potential at the emitter of the lateral pnp transistor $Q_1$ increases. When an operable voltage is given to the three npn transistors $Q_2$, $Q_3$, $Q_4$ following the lateral pnp transistor $Q_1$, an output signal is changed from the high level to the low level. In the present invention, $t_{PHL}$ (delay in time from the input to the output of the signal) is improved by determining the width of the base to be in the range of 5 μm to 7 μm.

| symbol | Width of base W (μm) | | | |
|---|---|---|---|---|
|  | 3 | 4 | 5 | 6 |
| $t_{PHL}$ | 9.1 | 7.1 | 5.7 | 5.5 |

(unit: ns)

Propagation time for output signal resulted from change in an input signal from a low level to a high level is shortened for the semiconductor integrated circuit device by determining the width of the base portion defined between the emitter layer and the collector layer of the lateral pnp transistor to be in the range from 5 μm to 7 μm.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor integrated circuit device comprising:
   a lateral pup transistor having a base to which an input signal is applied and an npn transistor having a base to which a potential appearing at the emitter of said pnp transistor is applied, said both transistors constituting a bipolar logic circuit, wherein the emitter and the collector of said pnp transistor are formed by the same p+diffusion layer and the width between said emitter diffusion layer and said collector diffusion layer is in the range from 5 microns to 7 microns, whereby a diffusion capacity is increased so that a rising time of emitter potential in said lateral pnp transistor is shortened.

2. A semiconductor integrated circuit device according to claim 1, wherein said collector diffusion layer is formed to surround said emitter diffusion layer.

* * * * *